US007430705B2

(12) United States Patent
Uchida

(10) Patent No.: US 7,430,705 B2
(45) Date of Patent: Sep. 30, 2008

(54) DATA RECORDING AND REPRODUCING SYSTEM, AND DATA RECORDING AND REPRODUCING METHOD

(75) Inventor: Akiyoshi Uchida, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 448 days.

(21) Appl. No.: 11/039,939

(22) Filed: Jan. 24, 2005

(65) Prior Publication Data

US 2005/0149826 A1 Jul. 7, 2005

Related U.S. Application Data

(63) Continuation of application No. PCT/JP03/00920, filed on Jan. 30, 2003.

(51) Int. Cl.
*H03M 13/00* (2006.01)
*H03M 13/03* (2006.01)

(52) U.S. Cl. ....................... 714/794; 714/795; 714/780; 714/755

(58) Field of Classification Search ................. 714/794, 714/795, 780, 755
See application file for complete search history.

(56) References Cited

U.S. PATENT DOCUMENTS

| | | | | |
|---|---|---|---|---|
| 6,029,264 | A * | 2/2000 | Kobayashi et al. | 714/755 |
| 6,615,385 | B1 * | 9/2003 | Kim et al. | 714/758 |
| 6,795,507 | B1 * | 9/2004 | Xin et al. | 375/265 |
| 6,829,305 | B2 * | 12/2004 | Kang et al. | 375/242 |
| 6,901,548 | B2 * | 5/2005 | Hattori et al. | 714/755 |
| 6,950,975 | B2 * | 9/2005 | Chang et al. | 714/755 |
| 6,965,652 | B1 * | 11/2005 | Burd et al. | 375/341 |
| 7,000,177 | B1 * | 2/2006 | Wu et al. | 714/801 |
| 7,010,051 | B2 * | 3/2006 | Murayama et al. | 375/262 |
| 7,032,155 | B2 * | 4/2006 | Itakura | 714/755 |
| 7,058,878 | B2 * | 6/2006 | Kanaoka et al. | 714/794 |
| 7,095,698 | B2 * | 8/2006 | Uchida | 369/59.24 |

FOREIGN PATENT DOCUMENTS

| | | |
|---|---|---|
| EP | 1161020 | 12/2001 |
| EP | 1170870 | 1/2002 |
| JP | 2000-134114 | 5/2000 |
| JP | 2000-165260 | 6/2000 |
| JP | 2001-230677 | 8/2001 |
| JP | 2002-009635 | 1/2002 |
| JP | 2002-217748 | 8/2002 |
| JP | 2003-006993 | 1/2003 |

* cited by examiner

*Primary Examiner*—Joseph D. Torres
(74) *Attorney, Agent, or Firm*—Staas & Halsey LLP

(57) ABSTRACT

A data recording and reproducing system adds a first error correcting code to input data to generate a first code block, encodes the first code block with a second error correcting code to generate a second code block, interleaves the second code block to generate a recording block, and records and reproduces the recording block via a partial response channel including a recording medium. An output signal from the partial response channel, and thus the second code block, is decoded; the decoded data and the reliability of the decoded data is determined, based on likelihood information obtained during iterative decoding; and the first error correcting code is decoded. The decoded data and the reliability information are supplied to the first error correcting code decoder.

8 Claims, 5 Drawing Sheets

100
110
USER DATA
$u_k$
160
ECC ENCODER
111
161
ENCODER UNIT
112
ENCODER
113
$P_k$
162
MUX AND PUNCTURE
114
ai
163
π
115
ci
164
LD DRIVER
116
OPTICAL DISK
120
REPRODUCTION SIGNAL
WRITE
READ
$y_i$
122
AMP
131
AGC
132
LPF
133
EQ
134
PR CHANNEL
140
123
A/D
135
124
ITERATIVE DECODER
136
153
CONTROLLER
137
ECC DECODER
138
DECODED USER DATA
$u_k'$
130

400
REPRODUCTION SIGNAL
$y_i$
124
MEMORY
301
PR CHANNEL APP
302
$L(c_i)$
$La(c_i)$
303
$Le(c)$
$\pi^{-1}$
304
DEMUX AND DEPUNCTURE
305
MUX AND PUNCTURE
307
308
$\pi$
309
$L(u_k)$
$L(p_k)$
CODE APP
306
$L(u*)$
$L(p*)$
HARD DECISION
310
$U_k$
153
DECODED DATA
401
PRELIMINARY HARD DECISION
402
PRELIMINARY DECISION DATA $U*_k$
RELIABILITY INFORMATION $R_k$
411
412
CRC
403
MUX
405
CRC
404
154
ECC DECODER
138

DATA RECORDING AND REPRODUCING SYSTEM, AND DATA RECORDING AND REPRODUCING METHOD

CROSS-REFERENCE TO RELATED APPLICATION

This application is a U.S. continuation application filed under 35 USC 111(a) claiming benefit under 35 USC 120 and 365(c) of PCT International Application No. PCT/JP03/00920 filed on Jan. 30, 2003, which is hereby incorporated herein by reference.

BACKGROUND OF THE INVENTION

The present invention generally relates to data reproducing systems, and, more particularly, to a data reproducing system that can decode data with higher precision even if there are errors in the data.

Magneto-optical recording and reproducing devices that are data recording and reproducing systems include various kinds of devices, varying from image information recording and recording devices to computer-readable code recording devices. As magneto-optical recording media have a large capacity and high compatibility, and exhibit high reliability with such devices, magneto-optical recording and reproducing devices are rapidly spreading in the market. Especially, with optical disk recording devices, optical disk media are expected to have larger data recording capacities.

While the data recording density of recording media is becoming higher in optical disk recording devices, there is an increasing demand for a method of performing data recording and reproducing with higher precision. As such a method of recording and reproducing data with higher precision, there are techniques such as the low density parity check (LDPC) or a turbo decoding technique by which data are turbo encoded and are recorded on a recording medium, and the data reproduced from the recording medium are decoded. In accordance with such a method, the data stream to be recorded is temporarily rearranged and is then modulated. The modulated signals are recorded on a recording medium. At the time of reproduction, the modulated signals are reproduced from the recording medium. When the reproduced signals are decoded, a unit decoding process is iteratively carried out so as to reproduce the original data.

The above described turbo encoding involves codes with great encoding gain, and is now drawing more and more attention in the fields of communication technology.

FIG. 1 illustrates the structure of an optical disk device as an example of a data recording and reproducing device that records data on an optical disk such as a magneto-optical disk and reproduces the data through iterative decoding. In the following, the operation of the optical disk device is described, with reference to the accompanying drawings.

The data recording and reproducing device 100 shown in FIG. 1 includes a recording system 110, an optical disk 120 as a recording medium, and a reproducing system 130.

The recording system 110 of the data recording and reproducing device 100 of FIG. 1 includes an ECC (error correcting code) encoder 111, an encoder unit 112, and a laser driver circuit 116. The encoder unit 112 encodes a data stream with error correcting codes through data encoding or the like. The error correcting codes are output from the ECC encoder 111. The encoder unit 112 of the recording system 110 of the data recording and reproducing device 100 shown in FIG. 1 includes an encoder 113, a MUX and puncture unit 114, and an interleaver (π) 115.

Using input user data $U_k$ 160 as information symbols, the ECC encoder 111 generates corresponding check symbols from the information symbols. The ECC encoder 111 combines the user data 160 and the check symbols, and outputs them as error correcting codes. After generating the error correcting codes, the ECC encoder 111 may perform interleave and then output the error correcting codes.

At the time of decoding, the error correcting codes encoded by the ECC encoder 111 can correct an error that is caused in the error correcting codes through recording or reproducing performed on the recording medium. Such an error can be corrected by calculating the error location and the error value in the error correcting codes, which is the first method. If the location of an error caused in the error correcting codes is already known, the data at the error location may be regarded as lost, and lost correction may be performed, which is the second method. In general, a larger number of errors can be corrected in one error correcting code by the second method of lost correction than by the first method of error correction. To perform lost correction, however, the location of lost data needs to be detected in advance, as described above.

The encoder 113 generates a string of parity bits $p_k$ 162 corresponding to an ECC encoder output 161 to be recorded. FIG. 2 shows an example structure of the encoder 113. The encoder 113 shown in FIG. 2 includes adders 201 and 202, and delay elements 203 and 204. The delay elements 203 and 204 may be formed with shift registers. The ECC encoder output 161 is input to the adder 201, and is then combined with the outputs of the delay elements 203 and 204. The output of the adder 201 is input to the delay element 203. The adder 201 and the delay elements 203 and 204 constitute a feedback unit. Meanwhile, the parity bit string $p_k$ 162 is formed by the adder 202 adding the output of the adder 201 and the output of the delay element 204.

The MUX and puncture unit 114 shown in FIG. 1 combines the ECC encoder output 161 and the parity bit string $p_k$ 162 generated from the encoder 113 in compliance with predetermined rules, and thins out the obtained bit string in compliance with predetermined rules (a puncture function), thereby generating an encoded data bit string $a_i$ 163.

The interleaver (π) 115 rearranges the order in the encoded data bit string $a_i$ 163 that is output from the MUX and puncture unit 114, and thus generates another encoded data bit string $c_i$ 164.

Based on the encoded data bit string $c_i$ 164, the laser driver circuit 116 controls the quantity of laser beam emission, and writes the encoded data bit string $c_i$ 164 onto the optical disk 120.

Meanwhile, the reproducing system 130 of the data recording and reproducing device 100 shown in FIG. 1 includes an amplifier 131, an automatic loop gain controller (or AGC: automatic gain controller) 132, a low pass filter 133, an equalizer 134, an analog-to-digital converter (A/D converter) 135, an iterative decoder 136, a controller 137, and an ECC decoder 138. The iterative decoder 136 of the reproducing system 130 shown in FIG. 1 has a memory on its input side.

A MO reproduction signal reproduced from the optical disk 120 by an optical head is subjected to waveform rectification through the amplifier 131, the AGC 132, the low pass filter 133, and the equalizer 134. If data recording is performed at such a high density as to cause waveform interference between two neighboring bits in the data recorded on the recording medium 120, the reproduction signal 122 reproduced from the magneto-optical disk 120 can be equalized to a PR waveform (partial response waveform) 123. Accordingly, the unit formed with the optical disk 120, amplifier 131, the AGC 132, the low pass filter 133, and the equalizer 134 can be regarded as a PR channel (partial response channel) 140. The output signal 123 of the equalizer 134 can be regarded as an actually encoded signal, as the data passes through the PR channel (partial response channel) 140. Thus, the output signal 161 of the ECC encoder 111 can be turbo encoded through the encoding function of the recording system 110 and the actual encoding function of the PR channel 140.

The signal 123 that is waveform-equalized by the PR channel 140 is then converted into a digital value by the A/D converter 135. Sampling values $y_i$ that are sequentially output from the A/D converter 135 are stored in the memory in the iterative decoder 136. The sampling values $y_i$ 124 stored in the memory are then iteratively decoded (turbo decoded) by the iterative decoder 136.

As described above, the iterative decoder 136 has a decoding function that is compatible with the encoder 113 of the recording system 110 and the actual encoding function of the PR channel 140. FIG. 3 shows an example structure of the iterative decoder 136.

The iterative decoder 300 shown in FIG. 3 is an example of the iterative decoder 136, and includes a memory 301, a PR channel decoder 302, a subtractor 303, a deinterleaver ($\pi^{-1}$) 304, a DEMUX and depuncture unit 305, a code decoder 306, a MUX and puncture unit 307, a subtractor 308, an interleaver ($\pi$) 309, and a hard decision unit 310.

The memory 301 stores the digital values converted by the A/D converter 135, as described above.

The PR channel decoder 302 is a decoder that is compatible with the actual encoding function of the PR channel 140, and a first a posteriori probability decoder that performs APP decoding (a posteriori probability decoding).

More specifically, the PR channel decoder 302 calculate a log-likelihood ratio $L(c_i{*})$ that is the ratio of the probability $P(c_i=1|Y)$ of a bit $c_i$ being 1 to the probability $P(c_i=0|Y)$ of the bit $c_i$ being 0, on the condition that the input sampling value Y $(y_1, y_2, \ldots, y_n)$ sampled by the A/D converter 135 is detected.

The subtractor 303 subtracts a priori information $La(c_i)$ based on the output of the code decoder 306, from the likelihood information $L(c_i{*})$ output from the PR channel decoder 302, thereby obtaining external likelihood information Le(c). The stream of external likelihood information Le(c) sequentially obtained in this manner is rearranged by the deinterleaver ($\pi^{-1}$) 304, and is then supplied to the DEMUX and depuncture unit 305. The DEMUX and depuncture unit 305 divides the stream of likelihood information into a stream of likelihood information $L(u_k)$ corresponding to a data bit $u_k$ and a stream of likelihood information $L(p_k)$ corresponding to a parity bit $p_k$.

At the time of the dividing, the information subtracted by the MUX and puncture unit 114 of the recording system 110 shown in FIG. 1 is added in accordance with the rules corresponding to the thinning (puncture) rules. This is called the "depuncture" function.

The code decoder 306 is compatible with the encoder 113 of the recording system 110 shown in FIG. 1, and serves as a second a posteriori probability decoder that performs APP decoding.

More specifically, based on the likelihood information $L(u_k)$ corresponding to the data bit and the likelihood information $L(p_k)$ corresponding to the parity bit, the code decoder 306 calculates a log-likelihood ratio L(u*) that is represented by the a posteriori probabilities (the probability of $u_k=1$ and the probability of $u_k=0$) with respect to the data bit, and a log-likelihood ratio L(p*) that is represented by the a posteriori probabilities (the probability of $p_k=1$ and the probability of $p_k=0$) with respect to the parity bit.

The stream of log-likelihood ratios L(u*) and the stream of log-likelihood ratios L(p*) sequentially output from the code encoder 306 are supplied to the MUX and puncture unit 307. The MUX and puncture unit 307 integrates the stream of logarithmic likelihood ratios L(u*) and the stream of logarithmic likelihood ratios L(p*).

At the time of the integration, the MUX and puncture unit 307 performs information thinning in accordance with predetermined rules (a "puncture" function). As a result, the MUX and puncture unit 307 outputs likelihood information L(c*). The a priori information Le(c) to be supplied to the code encoder 306 (before the dividing into $L(u_k)$ and $L(p_k)$) is then subtracted from the above likelihood information L(c*) by the subtractor 308. As a result, the external likelihood information $La(c_i)$ is obtained. The external likelihood information $La(c_i)$ is supplied as a priori information to the PR channel decoder 302 via the interleaver ($\pi$) 309.

As described above, the iterative decoder 136 that has the PR channel decoder 302 and the code decoder 306 can iteratively perform decoding using the a priori information exchanged between the two decoders. This is called "iterative decoding".

In this manner, based on the log-likelihood ratio L(u*) with respect to the data bit $u_k$ output from the code decoder 306 when the iterative decoding is performed a predetermined number of times, the hard decision unit 310 determines whether the data bit $u_k$ is 1 or 0. If the log-likelihood ratio L(u*) is greater than 0, the data bit $u_k$ is determined to be 1. If the log-likelihood ratio L(u*) is smaller than 0, the data bit $u_k$ is determined to be 0. The determination result is output as decoded data 153 representing the decoding result of the iterative decoder 136. The decoded data 153 is transmitted to the controller 137, which performs a CRC (cyclic redundancy check). Through the CRC, the controller 137 detects an error in the decoded data 153, and determines whether a retry ("re-reproduction") is necessary.

The decoded data 153 obtained by the iterative decoder 136 is transmitted to the ECC decoder 138. If there is an error in the decoded data 153, the ECC decoder 138 calculates the location and the value of the error in the error correcting code, and thus corrects the error. Alternatively, where the location of the error caused in the error correcting code is somehow known in advance, the data at the location of the error is regarded as lost, and lost correction is performed on the error.

As the recording density of a recording medium is increased, the signal quality (such as SNR or signal to noise ratio) decreases. Therefore, a decoding method with higher precision is always desired. Turbo decoding enables decoding with higher precision. However, there is a problem with turbo decoding, because encoded user data is recorded and is then decoded through iterative decoding, as shown in FIG. 1. With turbo decoding, the entire encoded data unit is adversely affected by noise that is short but has great amplitude.

Through the iterative decoding, an error caused during the recording or reproducing performed on the recording medium is scattered over the entire data unit that is turbo encoded. As a result, the error cannot be corrected through an ECC.

When the above described error is caused, the entire data unit that is turbo encoded may be regarded as lost data, and then error correction may be performed. However, a data unit that is turbo encoded is often a long data unit so as to achieve a great SNR improving effect through the decoding. Therefore, if such a long data unit is treated as lost data, the correct data in the turbo encoded data unit is regarded as lost data, resulting in unnecessary lost correction. Also, in a case where errors are often caused, correction cannot be performed through ECC decoding.

SUMMARY OF THE INVENTION

A general object of the present invention is to provide data recording and reproducing systems in which the above disadvantages are eliminated.

A more specific object of the present invention is to provide a data recording and reproducing system that can decode original data with high precision even when an error is caused in reproduced data.

The above objects of the present invention are achieved by a data recording and reproducing system that adds a first error correcting code to input data to generate a first code block, encodes the first code block with a second error correcting code to generate a second code block, interleaves the second code block to generate a recording block, and records and reproduces the recording block via a partial response channel including a recording medium. This system includes an iterative decoder that iteratively decodes an output signal from the partial response channel, and decodes the second code block; a preliminary decision and reliability detection unit that preliminarily determines decoded data and determines reliability of the decoded data preliminarily determined, based on likelihood information obtained in the middle of iterative decoding in the iterative decoder; and a first error correcting code decoder that decodes the first error correcting code. In this system, the preliminary decision and reliability detection unit supplies the decoded data preliminarily determined and the reliability information of the decoded data to the first error correcting code decoder.

In a turbo decoding operation, two decoders, a PR channel decoder and a code decoder, are normally used. Between the two decoders, decoded data are exchanged, and decoding is iteratively performed.

In this manner, once decoded data are iteratively decoded. As a result, an error or errors existing in the data might spread in the other data areas. To counter this problem, a hard decision process is carried out and the reliability of the data is determined, before the once decoded data is iteratively decoded, or using soft decision data that is being iteratively decoded, in accordance with the present invention.

A CRC or the like is then performed on the ultimate decoding result of the iterative decoder for an error or errors. If a number of errors exist in the ultimate decoding result, the result of the hard decision process that is determined to have high reliability is regarded as definite data, or the data that are determined to have low reliability is regarded as lost data. In the latter case, the ECC decoder performs lost error correction, thereby performing data decoding.

Accordingly, the spread of data errors due to noise caused through recording or reproducing performed on a recording medium is minimized, and lost correction can be performed by the ECC decoder or the like. Thus, data can be decoded with high precision.

The above and other objects and features of the present invention will become more apparent from the following description taken in conjunction with the accompanying drawings.

DESCRIPTION OF THE PREFERRED EMBODIMENTS

The following is a description of embodiments of the present invention, with reference to the accompanying drawings.

Figure 3:
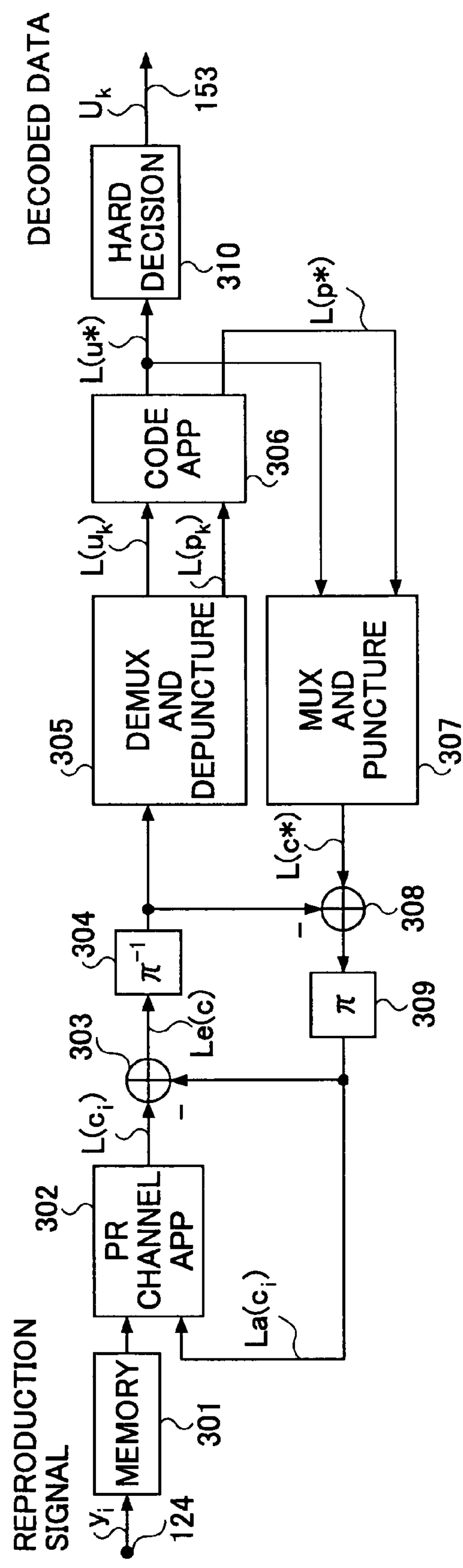
FIG. 3 illustrates the basic structure of a conventional iterative decoder.
Figure 4:
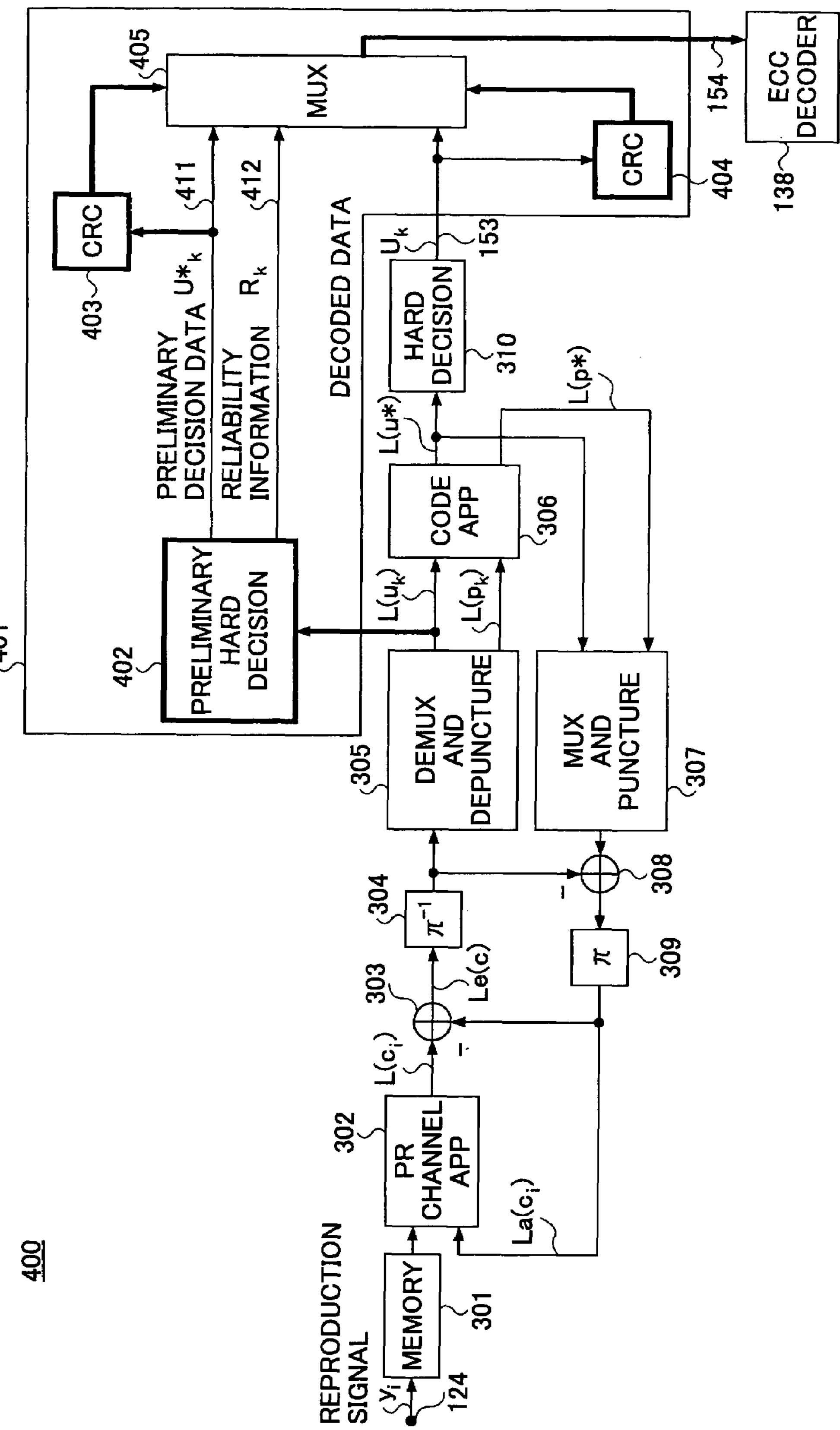
FIG. 4 illustrates an iterative decoder as an embodiment of the present invention.

FIG. 4 illustrates the structure of an iterative decoder 400 as an embodiment of the present invention. The iterative decoder 400 shown in FIG. 4 includes a memory 301, a PR channel decoder 302, a subtractor 303, a deinterleaver ($\pi^{-1}$) 304, a DEMUX and depuncture unit 305, a code decoder 306, a MUX and puncture unit 307, a subtractor 308, an interleaver ($\pi$) 309, a hard decision unit 310, and a preliminary decision and reliability detection unit 401. The embodiment shown in FIG. 4 has the same structure as the conventional iterative decoder 300 shown in FIG. 3, except for the preliminary decision and reliability detection unit 401. The preliminary decision and reliability detection unit 401 includes a preliminary hard decision unit 402, CRC circuits 403 and 404, and a multiplexer 405.

Figure 1:
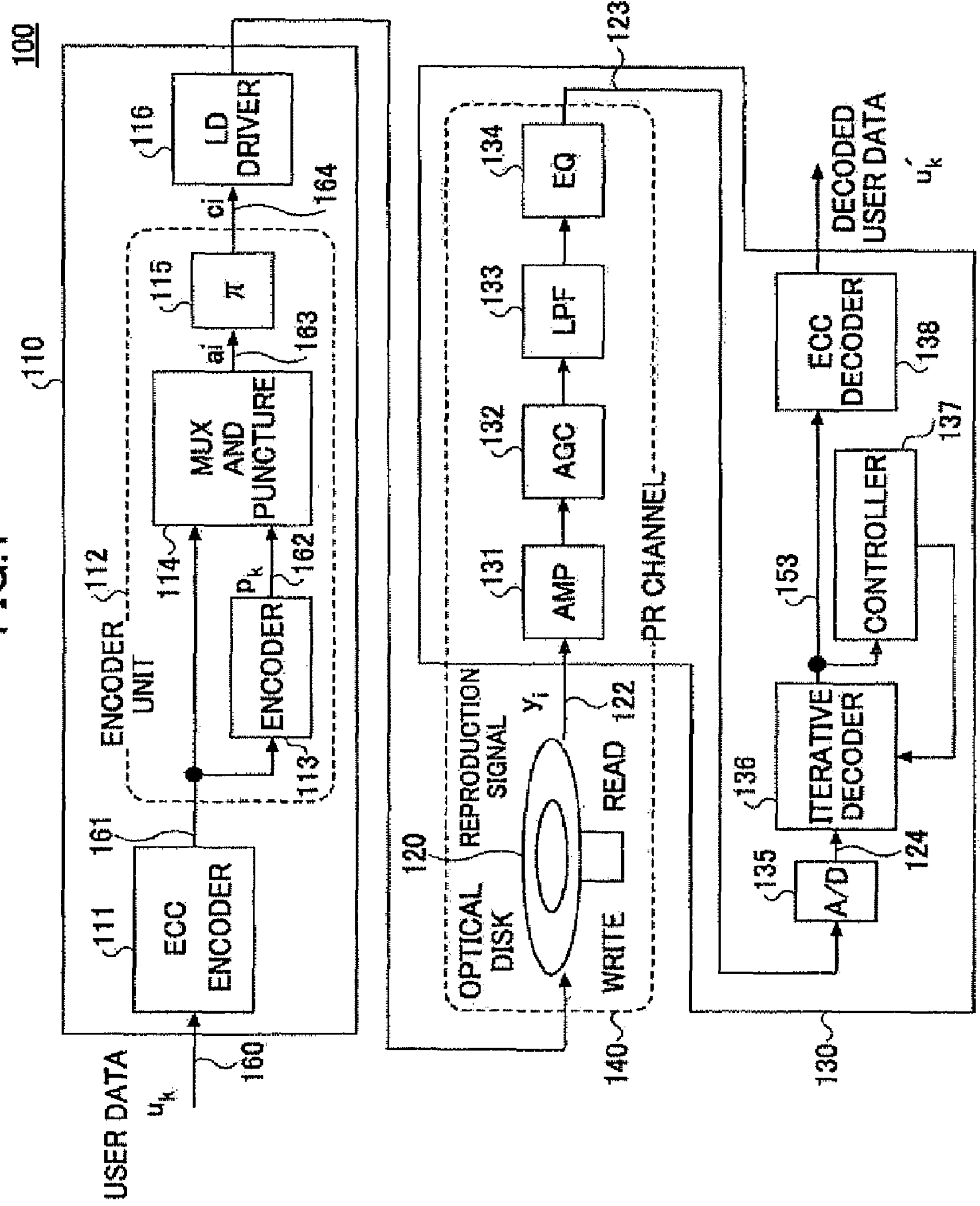
FIG. 1 illustrates the structure of an optical disk recording and reproducing system that utilizes a conventional iterative decoding technique.
Figure 2:
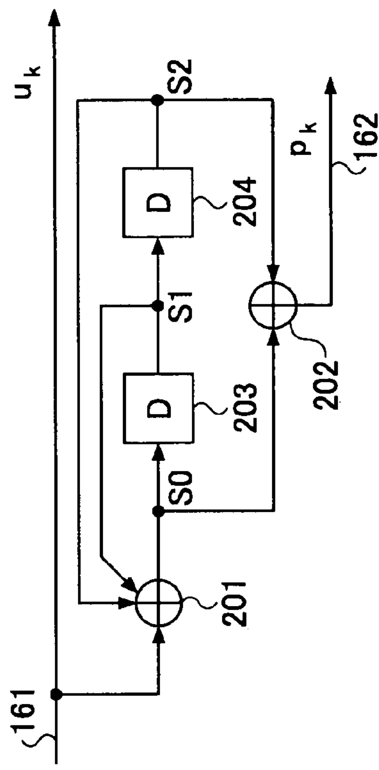
FIG. 2 illustrates an example structure of the encoder that is used for conventional turbo encoding.

A reproduction signal $y_i$ 124 that is digitized by the A/D converter 135 shown in FIG. 1 is temporarily stored in the memory 301, as in the case described with reference to FIG. 3. While the reproduction signal $y_i$ 124 is being read out from the memory 301, the PR channel decoder 302 first performs a posteriori probability decoding. The subtractor 303 then subtracts a priori information $La(c_i)$ based on the output of the code decoder 306 from the likelihood information $L(C_i^*)$ output from the PR channel decoder 302. As a result, the external likelihood information $Le(c)$ is obtained. The external likelihood information $Le(c)$ is rearranged by the deinterleaver ($\pi^{-1}$) 304 and is supplied to the DEMUX and depuncture unit 305. The DEMUX and depuncture unit 305 divides the sequentially input stream of likelihood information into a stream of likelihood information $L(u_k)$ corresponding to a data bit $u_k$ and a stream of likelihood information $L(p_k)$ corresponding to a parity bit $p_k$. The stream of likelihood information $L(u_k)$ is a result of a soft decision made on a stream of user data.

Next, the operation of the preliminary decision and reliability detection unit 401 is described.

First, the preliminary hard decision unit 402 determines the soft decision result $L(u_k)$ output from the DEMUX and depuncture unit 305, using a predetermined threshold value. Thus, preliminary hard decision data 411 is obtained. At the same time, the preliminary hard decision unit 402 determines reliability information 412 as to the preliminary hard decision data 411, and outputs the preliminary hard decision data 411 and the reliability information 412. The determination of the reliability information is described later in detail.

The CRC unit 403 performs a CRC on the preliminary hard decision data 411 determined by the preliminary hard decision unit 402. The CRC 404 performs a CRC on the decoded data 153 which is decoded by the hard decision unit 310 and is the ultimate iterative decoding result of the iterative decoder 400. Based on the check result of the CRC unit 403 and the check result of the CRC unit 404, the multiplexer 405 is controlled so that the preliminary hard decision data 411 and the reliability information 412 determined by the preliminary hard decision unit 402 or the decoded data 153 decoded by the hard decision unit 310 are transmitted from the multiplexer 405 to the ECC decoder 138. This is carried out in the following manner.

1) In a case where an error is not detected or the number of errors detected is less than a predetermined number after the CRC unit 404 performs a CRC on the decoded data 153 output from the hard decision unit 310, the multiplexer 405 selects the decoded data 153 and sends the decoded data 153 to the ECC decoder 138.

2) In a case where the number of errors detected is greater than the predetermined number after the CRC unit 404 performs a CRC on the decoded data 153 output from the hard decision unit 310, the CRC unit 403 performs a CRC on the preliminary hard decision data 411 determined by the preliminary hard decision unit 402. If the CRC unit 403 determines that the preliminary hard decision data 411 does not contain an error, the multiplexer 405 selects the preliminary hard decision data 411, and sends only the preliminary hard decision data 411 to the ECC decoder 138. Here, the reliability information 412 is not sent to the ECC decoder 138.

3) In a case where the number of errors detected is greater than the predetermined number after the CRC unit 404 performs a CRC on the decoded data 153 output from the hard decision unit 310, the CRC unit 403 performs a CRC on the preliminary hard decision data 411 determined by the preliminary hard decision unit 402. If the CRC unit 403 determines that the preliminary hard decision data 411 contains an error or errors, the multiplexer 405 selects the preliminary hard decision data 411 and sends the preliminary hard decision data 411 to the ECC decodes 138. At the same time, the reliability information 412 is also sent as the lost flag of the preliminary hard decision data 411 to the ECC decoder 138.

Using the hard decision data and/or the lost flag sent from the multiplexer 405, the ECC decoder 138 performs error correction. If the lost flag is not sent, the ECC decoder 138 calculates the location and the value of the error in the error correcting code, and thus corrects the error. If the lost flag is sent, the ECC decoder 138 regards the data at the location represented by the lost flag as lost data, and performs lost correction.

In this manner, even when errors transmitted through noise are found in a decoding system that performs iterative decoding such as turbo decoding, the decoding is combined with ECC or the like, so as to perform accurate decoding.

Figure 5:
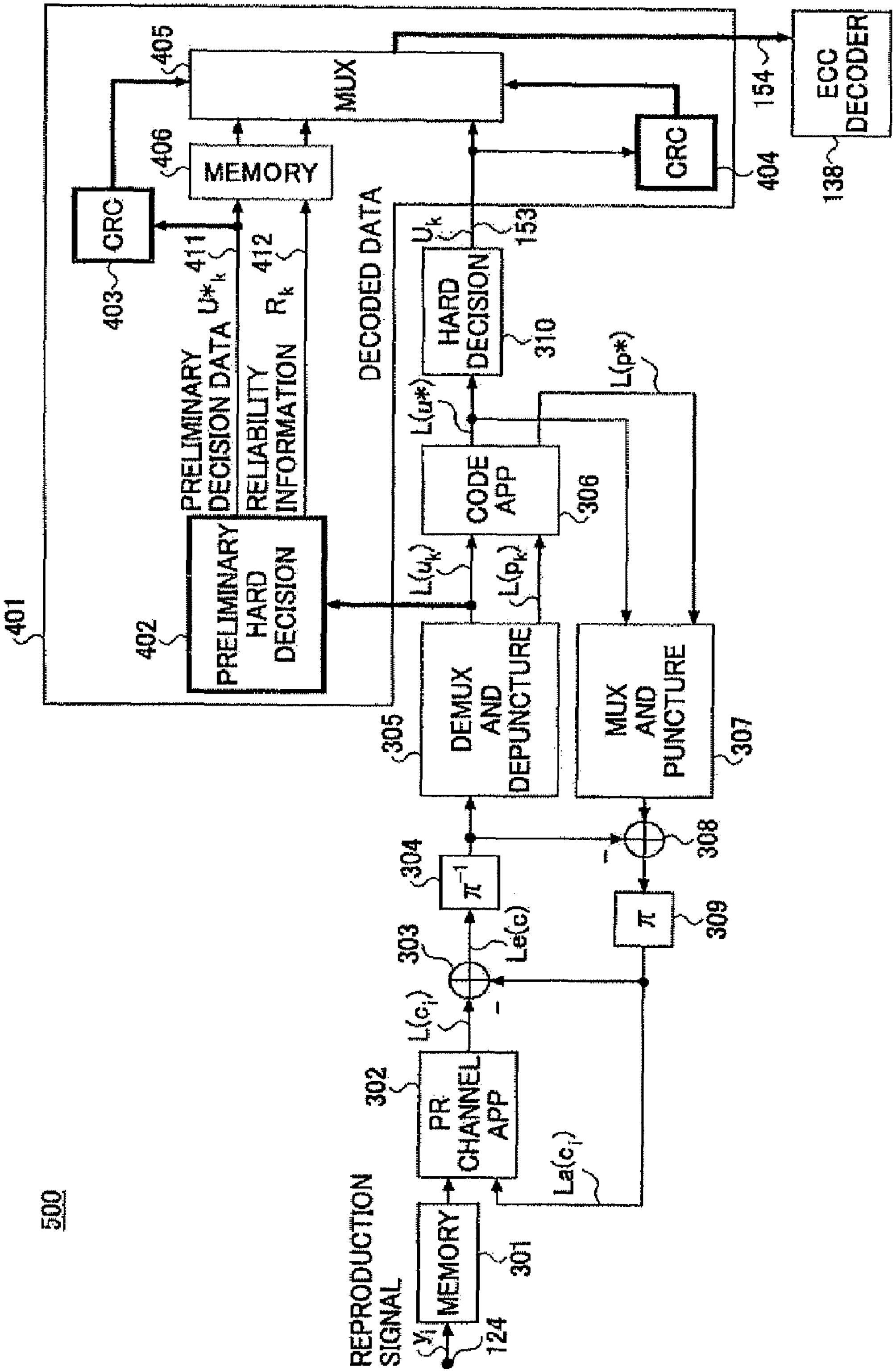
FIG. 5 illustrates an iterative decoder as another embodiment of the present invention.

FIG. 5 illustrates the structure of another embodiment of the present invention. In FIG. 5, the same components as those in FIG. 4 are denoted by the same reference numerals as those in FIG. 4.

The embodiment shown in FIG. 5 is the same as the embodiment shown in FIG. 4, except that the preliminary decision and reliability detection unit 401 has a memory 406 that stores the preliminary hard decision data 411 and the reliability information 412.

In the embodiment shown in FIG. 4, the CRC unit 404 performs a CRC on the decoded data 153 output from the hard decision unit 310, and, according to the result of the CRC, a CRC on the preliminary decision data 411 output from the preliminary hard decision unit 402 is performed, as described in the above procedures 1) through 3). In this embodiment, on the other hand, the preliminary hard decision unit 402 first operates to determine the preliminary hard decision data 411 and the reliability information 412. A CRC is then performed on the preliminary hard decision data 411, and the preliminary hard decision data 411 and the reliability information 412 are stored in the memory 406 provided in the preliminary decision and reliability detection unit 401. The CRC unit 404 then performs a CRC on the decoded data 153 that is output from the hard decision unit 310 and is the ultimate decoded result of the iterative decoder 500. Depending on the result of the CRC, the preliminary hard decision data 411 and the reliability information 412 stored in the memory 406 may be output to the ECC decoder 138, or the decoded data 153 is output to the ECC decoder 138.

Figure 6:
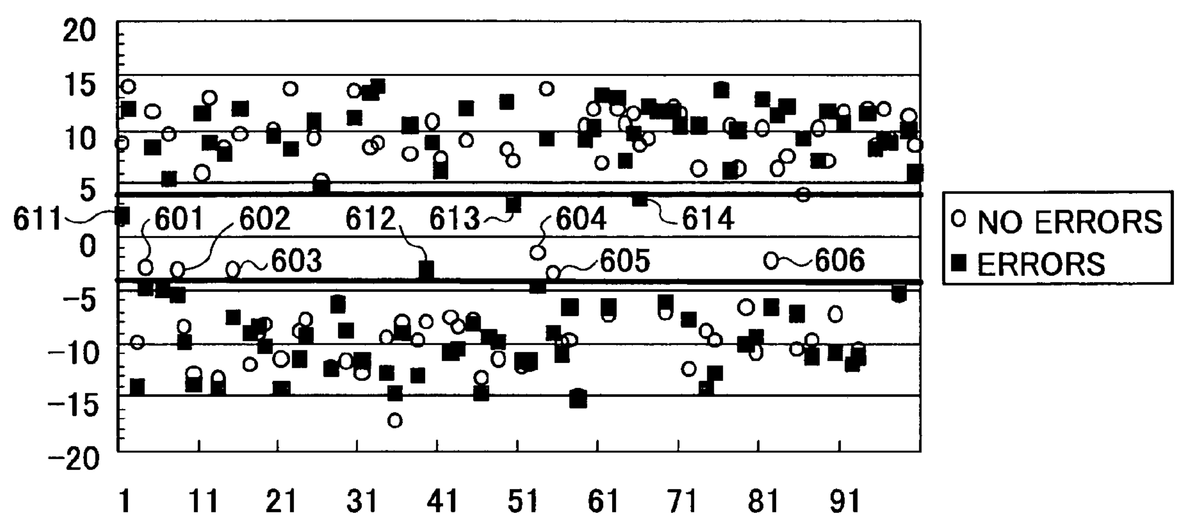
FIG. 6 illustrates examples of signals obtained in the embodiments of the present invention.

Referring now to FIG. 6, the method of determining the reliability is described.

FIG. 6 illustrates examples of the likelihood information L(uk). In FIG. 6, white round dots ("no errors") indicate cases where the decoded data 153 as the ultimate decoding result of the iterative decoder 400 shown in FIG. 4 and of the iterative decoder 500 shown in FIG. 5 does not contain an error. The black squares ("errors") indicate cases where the decoded data 153 as the ultimate decoding result of the iterative decoder 400 of FIG. 4 and of the iterative decoder 500 shown in FIG. 5 contains an error or errors.

The preliminary hard decision unit 402 shown in FIGS. 4 and 5 can make a preliminary hard decision on the likelihood information $L(u_k)$, with the value 0 being the threshold value. If the likelihood information $L(u_k)$ is equal to or greater than 0, with the value 0 being the threshold value, the decoded data 153 is determined to be "1". If the likelihood information $L(u_k)$ is smaller than 0, the decoded data 153 is determined to be "0". This result may be stored in the memory 406, and the reliability of the data on which the preliminary hard decision has been made may also be determined.

If the likelihood information L(uk) in the middle of decoding by the iterative decoder 400 of FIGS. 4 and 5 has a threshold value of +4 or greater, or −4 or smaller, the preliminary hard decision data 411 is determined to have high reliability. If the likelihood information L(uk) in the middle of decoding by the iterative decoder 400 of FIG. 4 and of the iterative decoder 500 shown in FIG. 5 has a threshold value between −4 and +4, the preliminary hard decision data 411 is determined to have low reliability, in the example shown in FIG. 6, the threshold values are +4 and −4. However, some other values may be used as the threshold values, depending on the recording and reproducing systems employed.

In FIG. 6, the six white dots 601 through 606 of "no errors", and the four black squares 611 through 614 of "errors" have absolute values of 4 or smaller. Accordingly, those dots and squares should be considered to represent low reliability. Meanwhile, the other white dots and black squares should be considered to represent high reliability.

As described above, the preliminary hard decision unit 402 can make a preliminary hard decision and a reliability decision on the likelihood information $L(u_k)$ in this embodiment.

It should be noted that the present invention is not limited to the embodiments specifically disclosed above, but other variations and modifications may be made without departing from the scope of the present invention.

What is claimed is:

1. A data recording and reproducing system that adds a first error correcting code to input data to generate a first code block, encodes the first code block with a second error correcting code to generate a second code block, interleaves the second code block to generate a recording block, and records and reproduces the recording block via a partial response channel including a recording medium, the system comprising:

an iterative decoder that iteratively decodes an output signal from the partial response channel, and decodes the second code block;

a preliminary decision and reliability detection unit that preliminarily determines decoded data and determines reliability of the decoded data, based on likelihood information obtained during iterative decoding in the iterative decoder; and a first error correcting code decoder that decodes the first error correcting code, the preliminary decision and reliability detection unit supplying the preliminarily determined decoded data and reliability information of the decoded data to the first error correcting code decoder, wherein the preliminary decision and reliability detection unit makes a preliminary hard decision based on the likelihood information obtained during iterative decoding, wherein the iterative decoder comprises a first a posteriori probability decoder that performs a posteriori probability decoding on the partial response channel, and a second a posteriori probability decoder that decodes the second code block, and the preliminary decision and reliability detection unit makes a preliminary hard decision based on the likelihood information obtained during iterative decoding that is supplied from the first a posteriori probability decoder.

2. The data recording and reproducing system as claimed in claim 1, wherein reliability information of the preliminarily determined decoded data is obtained as a result of a determination performed on the likelihood information during iterative decoding, the determination involving a predetermined threshold value.

3. The data recording and reproducing system as claimed in claim 2, wherein the preliminary decision and reliability detection unit determines whether the reliability information of the decoded data preliminary determined is to be supplied to the first error correcting code decoder, based on the decoding result of the iterative decoder decoding the second code block.

4. The data recording and reproducing system as claimed in claim 1, wherein the preliminary decision and reliability detection unit has a memory, stores the preliminarily determined decoded data and reliability information of the decoded data in the memory, and, based on the result of the iterative decoder decoding the second code block, determines whether the preliminarily determined decoded data and reliability information of the decoded data stored in the memory are to be output to the first error correcting code decoder or the result of the iterative decoder decoding the second code block is to be output to the first error correcting code decoder.

5. A data recording and reproducing method in which a first error correcting code is added to input data to generate a first code block, the first code block is encoded with a second error correcting code to generate a second code block, the second code block is interleaved to generate a recording block, and the recording block is recorded and reproduced via a partial response channel including a recording medium, the method comprising the steps of:

iteratively decoding an output signal from the partial response channel, thereby decoding the second code block;

preliminarily determining decoded data and detecting reliability of the preliminarily determined decoded data, based on likelihood information obtained during iterative decoding in the iterative decoder; and decoding the first error correcting code, the step of preliminarily determining the decoded data and detecting the reliability includes supplying the preliminarily determined decoded data and reliability information of the decoded data to the step of decoding the first error correcting code, wherein the step of preliminarily determining the decoded data and detecting the reliability includes making a preliminary hard decision based on the likelihood information obtained during iterative decoding, the step of iteratively decoding an output signal includes the steps of performing first a posteriori probability decoding on the partial response channel, and performing second a posteriori probability decoding to decode the second code block; and the step of preliminarily determining the decoded data and detecting the reliability includes making a preliminary hard decision based on the likelihood information obtained during iterative decoding, the likelihood information being provided through the step of performing the first a posteriori probability decoding.

6. The method as claimed in claim 5, wherein reliability information of the preliminarily determined decoded data includes the value of a result of a determination performed on the likelihood information during iterative decoding, the determination involving a predetermined threshold value.

7. The method as claimed in claim 6, wherein the step of preliminarily determining the decoded data and detecting the reliability includes determining whether the reliability information of the decoded data preliminary determined is to be supplied to the step of decoding the first error correcting code, based on the decoding result of the step of decoding the second code block.

8. The method as claimed in claim 5, wherein the step of preliminarily determining the decoded data and detecting reliability includes storing the preliminarily determined decoded data and reliability information of the decoded data in the memory, and, based on the result of the step of iteratively decoding the output signal to decode the second code block, determining whether the preliminarily determined decoded data and reliability information of the decoded data are to be output to the step of decoding the first error correcting code or the result of the step of iteratively decoding the output signal to decode the second code block is to be output to the step of decoding the first error correcting code.

* * * * *

UNITED STATES PATENT AND TRADEMARK OFFICE

CERTIFICATE OF CORRECTION

PATENT NO. : 7,430,705 B2
APPLICATION NO. : 11/039939
DATED : September 30, 2008
INVENTOR(S) : Akiyoshi Uchida It is certified that error appears in the above-identified patent and that said Letters Patent is hereby corrected as shown below:

Column 9, Line 32, change “preliminary” to --preliminarily--.

Column 10, Line 38, change “preliminary” to --preliminarily--.

Signed and Sealed this

Sixteenth Day of February, 2010

David J. Kappos

David J. Kappos
*Director of the United States Patent and Trademark Office*